(12) United States Patent
Chang et al.

(10) Patent No.: US 8,391,091 B2
(45) Date of Patent: Mar. 5, 2013

(54) ANTI-FUSE CIRCUIT AND METHOD FOR ANTI-FUSE PROGRAMMING AND TEST THEREOF

(75) Inventors: Chien-Yi Chang, Hsinchu (TW); Ming-Chien Huang, New Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 89 days.

(21) Appl. No.: 13/187,534

(22) Filed: Jul. 21, 2011

(65) Prior Publication Data

US 2013/0021851 A1    Jan. 24, 2013

(51) Int. Cl.
*G11C 7/00*         (2006.01)
(52) U.S. Cl. ............... 365/201; 365/189.07; 365/225.7; 365/96
(58) Field of Classification Search ................ 365/201, 365/189.07, 225.7, 96, 189.02
See application file for complete search history.

(56) References Cited

U.S. PATENT DOCUMENTS

| | | | |
|---|---|---|---|
| 6,781,887 B2 | 8/2004 | Gelsomini et al. | |
| 6,967,881 B2 * | 11/2005 | Sasaki et al. | ............. 365/201 |
| 7,254,079 B2 | 8/2007 | Sumi et al. | |
| 7,397,720 B2 | 7/2008 | Sumi et al. | |

* cited by examiner

*Primary Examiner* — David Lam
(74) *Attorney, Agent, or Firm* — Jianq Chyun IP Office (57) ABSTRACT

An anti-fuse circuit including a plurality of programmable units and a test module is provided. The programmable units receive a stress voltage, a program data, and a write enable signal. During a programming period, the programmable units sequentially transmit the program data. When the write enable signal is enabled, the stress voltage stresses the programmable units according to the program data, and the programmable units output programming results for test. The test module is coupled to the programmable units and receives the program data and the programming results. During a test period, the test module compares the programming results with the program data and outputs different logic levels according to a result of the comparison of the first programming results and the program data. A method for anti-fuse programming and test adapted to the foregoing anti-fuse circuit is also provided.

19 Claims, 7 Drawing Sheets

ANTI-FUSE CIRCUIT AND METHOD FOR ANTI-FUSE PROGRAMMING AND TEST THEREOF

BACKGROUND OF THE INVENTION

1. Field of the Invention

The invention relates to an electrical circuit and a method for circuit programming and test, and more particularly to an anti-fuse circuit and a method for anti-fuse programming and test.

2. Description of Related Art

Conventional anti-fuses are similar in construction to capacitors. The anti-fuses have a pair of conductive plates separated from each other by a dielectric such as oxide or nitride. The dielectric is changed into a conductive regime by applying a differential voltage between the plates, where the differential voltage is sufficient to break down the dielectric, such that the electrical connection between the plates is established.

Typically, a high programming voltage is applied to the integrated circuit (IC) externally. It is a disadvantage of the anti-fuses that the programmed resistance may vary over a considerable range and is often far higher than the desired. Furthermore, the magnitude of the programming voltage that can be applied to the anti-fuses is severely limited due to the presence of other circuitry.

SUMMARY OF THE INVENTION

Accordingly, the invention is directed to an anti-fuse circuit of which the programming is serial, such that it is easy to check whether the programming finishes or not, and the serial programming is convenient to memory address.

The invention provides an anti-fuse circuit including a plurality of programmable units and a test module. The programmable units receive a stress voltage, a program data, and a write enable signal. During a programming period, the programmable units sequentially transmit the program data. When the write enable signal is enabled, the stress voltage stresses the programmable units according to the program data, and the programmable units output first programming results for test. The test module is coupled to the programmable units and receives the program data and the first programming results. During a test period, the test module compares the first programming result with the program data and outputs different logic levels according to a result of the comparison of the first programming results and the program data.

According to an embodiment of the invention, each of the programmable units includes an anti-fuse unit and a shift register. The anti-fuse unit has a first input end, a second input end, a first output end, and a second output end. The first input end of the anti-fuse unit receives the write enable signal. The second input end of the anti-fuse unit receives the program data. The first output end of the anti-fuse unit outputs a corresponding one of the first programming results. The second output end of the anti-fuse unit outputs a corresponding second programming result. The shift register has an input end, a clock input end, and an output end. The input end of the shift register receives the program data. The clock input end of the shift register receives a clock signal. The output end of the shift register outputs the program data to the second input end of the corresponding anti-fuse unit.

In order to make the features and advantages of the invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
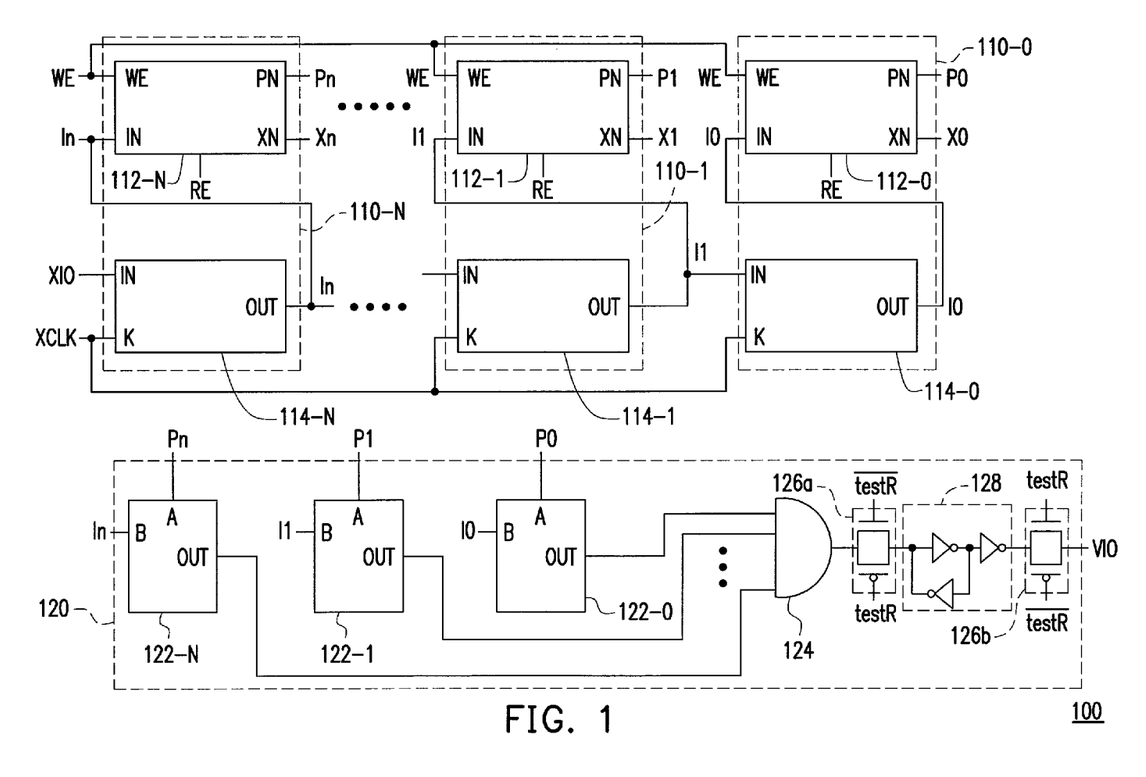
FIG. 1 is a block diagram of an anti-fuse circuit according to an exemplary embodiment of the invention.

FIG. 1 is a block diagram of an anti-fuse circuit according to an exemplary embodiment of the invention. Referring to FIG. 1, the anti-fuse circuit 100 of the present embodiment includes a plurality of programmable units 110-0 to 110-N and a test module 120. Herein, the test module 120 is coupled to the programmable units 110-0 to 110-N.

The programmable units 110-0 to 110-N receive a program data XIO including I0 to In and a write enable signal WE. During a programming period, the programmable units 110-N to 110-0 sequentially transmit the program data I0 to In. When the write enable signal WE is enabled, the programmable units 110-0 to 110-N are stressed by a stress voltage (not shown) according to the program data I0 to In, and then the programmable units 110-0 to 110-N output first programming results P0 to Pn for test. Next, the test module 120 receives the program data I0 to In and the first programming results P0 to Pn. During a test period, the test module 120 compares the first programming results P0 to Pn with the program data I0 to In and outputs a logic signal VIO with different logic levels such as a logic high or a logic low according to the comparison results. In the present embodiment, the programming and test are serial, such that it is easy to check whether the programming finishes or not, and the serial programming is convenient to memory address.

Specifically, each of the programmable units 110-0 to 110-N includes an anti-fuse unit and a shift register, e.g. the programmable unit 110-0 including an anti-fuse unit 112-0 and a shift register 114-0. The programmable unit 110-0 is exemplary in the following. The anti-fuse unit 110-0 has a first input end WE, a second input end IN, a first output end PN, and a second output end XN. The first input end WE of the anti-fuse unit 112-0 receives the write enable signal WE.

The second input end IN of the anti-fuse unit 112-0 receives the program data I0. The first output end PN of the anti-fuse unit 112-0 outputs the first programming result P0. The second output end XN of the anti-fuse unit 112-0 outputs a second programming result X0. The other programmable units 110-1 to 110-N are similar thereto. It should be note that the different anti-fuse units 112-0 to 112-N correspondingly receive different program data and output different programming results.

Next, the shift register 114-0 has an input end IN, a clock input end K, and an output end OUT. The input end IN of the shift register 114-0 receives the program data I1. The clock input end K of the shift register 114-0 receives a clock signal XCLK. The output end OUT of the shift register 114-0 outputs the program data I0 to the second input end IN of the anti-fuse unit 110-0. Under the architecture of the programmable units 110-0 to 110-N as shown in FIG. 1, the shift registers 114-0 to 114-N are controlled by the clock signal XCLK and sequentially transmit the program data I0 to In during the programming period. For example, the shift register 114-N receives the program data XIO and sequentially transmits the program data I0 to In from the shift register 114-N to 114-0.

On the other hand, the test module 120 includes a plurality of test units 122-0 to 122-N, an AND gate 124, two switch units 126a and 126b, and a latch unit 128. The test units 122-0 to 122-N are coupled to the programmable units 110-0 to 110-N one for one. For example, the test unit 122-0 is coupled to the programmable unit 110-0, the test units 122-1 is coupled to the programmable unit 110-1, and so forth. Each of the test units 122-0 to 122-N has a first input end B, a second input end A, and an output end OUT. The first input ends B of the test units 122-0 to 122-N respectively receive the program data I0 to In. The second input ends A of the test units 122-0 to 122-N respectively receive the programming results P0 to Pn. The output ends OUT of the test units 122-0 to 122-N respectively output the different logic levels according to the comparison results. During the test period, the test units 122-0 to 122-N respectively receive the program data I0 to In and the programming results P0 to Pn, compare the first programming results with the program data, and then output the different logic levels according to the comparison results. For example, if the program data I0 and the programming result P0 match, the test unit 122-0 would output a logic high; and by contrast, if the program data I0 and the programming result P0 mismatch, the test unit 122-0 would output a logic low. The other test units 122-1 to 122-N operate in the same manner as that of the test unit 122-0, and it will not be described again herein.

The AND gate 124 is coupled to the output ends of the test units 122-0 to 122-N. The AND gate 124 performs an AND operation on the logic levels outputted from the test units 122-0 to 122-N and outputs an operation result. In the present embodiment, if the programming results P0 and Pn matches the program data I0 to In, the AND gate 124 would output a logic high; and if not, the AND gate 124 would output a logic low. The switch unit 126a is coupled to an output end of the AND gate 124 and controlled by a test signal testR. The latch unit 128 is coupled to the switch unit 126a and latches the operation result when the switch unit 126a is turned on by the test signal testR. The switch unit 126b is coupled to the latch unit 128 and also controlled by the test signal testR. When the switch unit 126b is turned on by the test signal testR, the latch unit 128 outputs the operation result as a test result VIO. Accordingly, in the present embodiment, if the programming results P0 to Pn matches the program data I0 to In, the test module 120, for example, would output the test result VIO with logic high to represent the test passes. On the contrast, if the programming results P0 to Pn mismatch with the program data I0 to In, the test module 120, for example, would output the test result VIO with logic low to represent the test fails.

Figure 2:
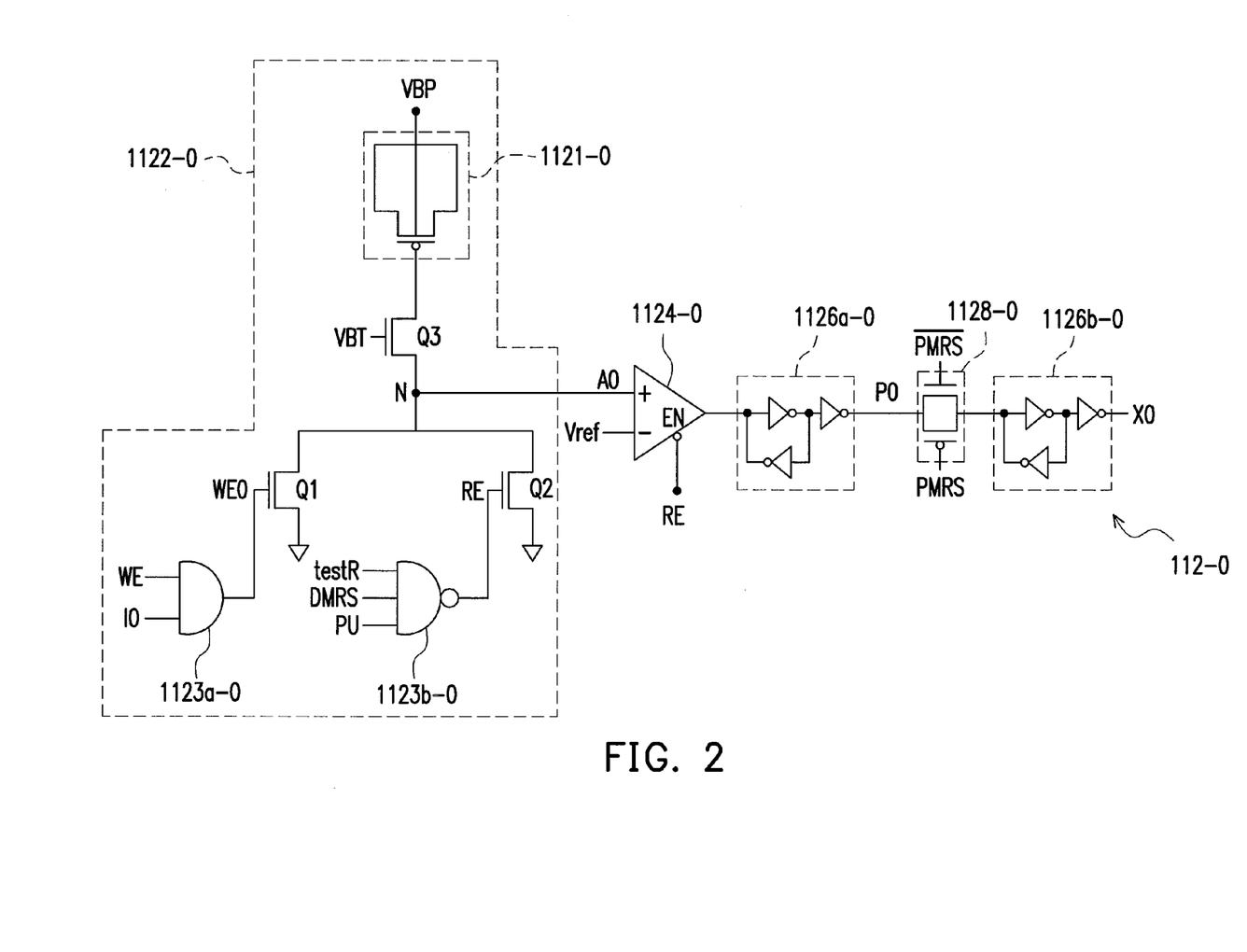
FIG. 2 illustrates a circuit diagram of the anti-fuse unit shown in FIG. 1 according to an exemplary embodiment of the invention.
Figure 3:
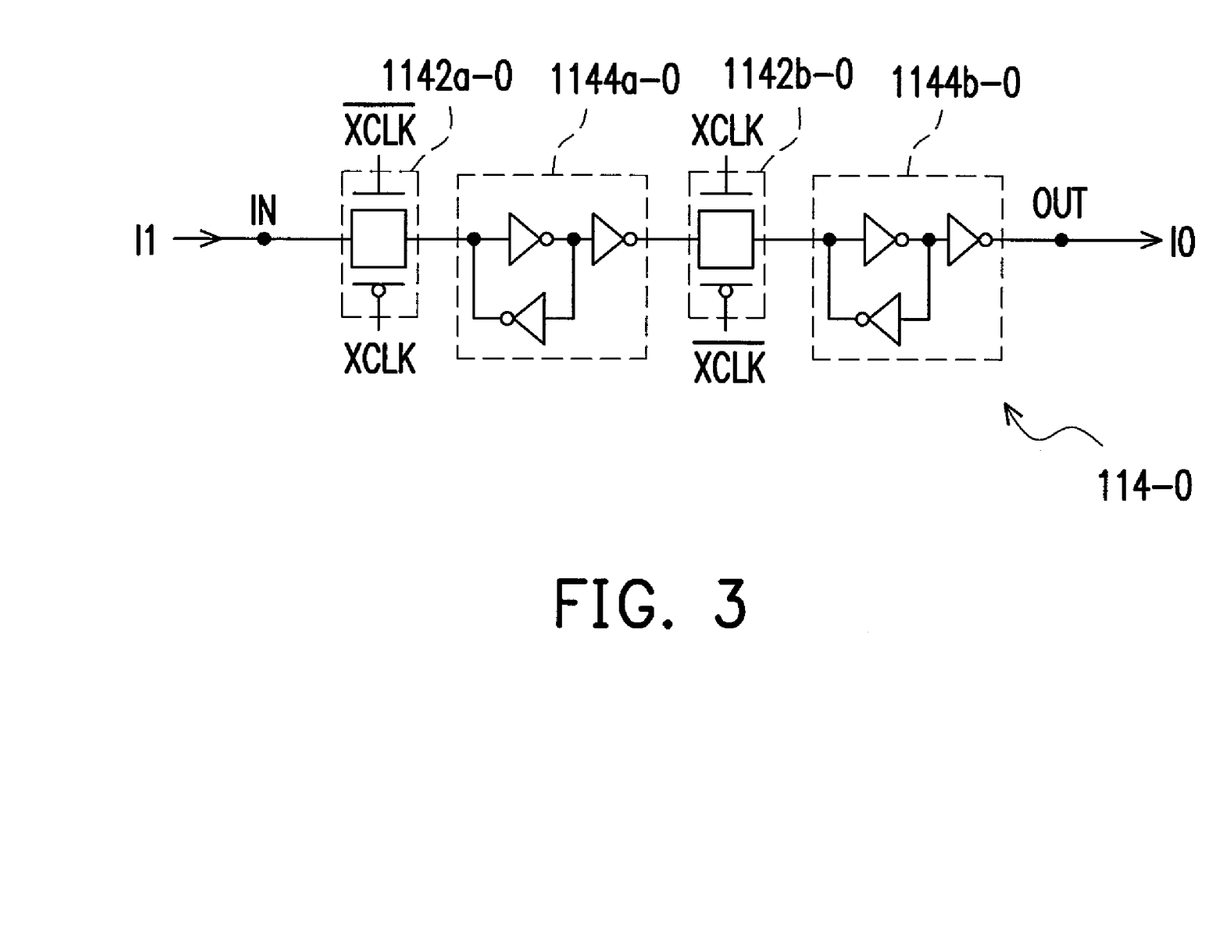
FIG. 3 illustrates a circuit diagram of the shift register shown in FIG. 1 according to an exemplary embodiment of the invention.
Figure 4:
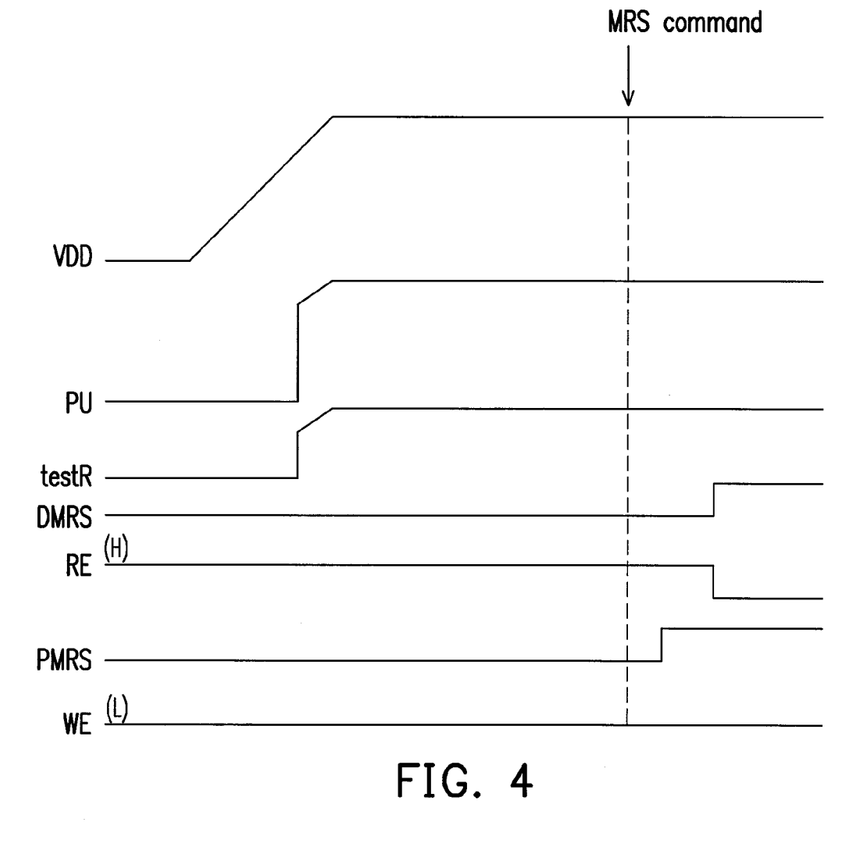
FIG. 4 shows waveforms of signals in FIG. 1 to FIG. 3 during the normal operation according to an exemplary embodiment of the invention.
Figure 5:
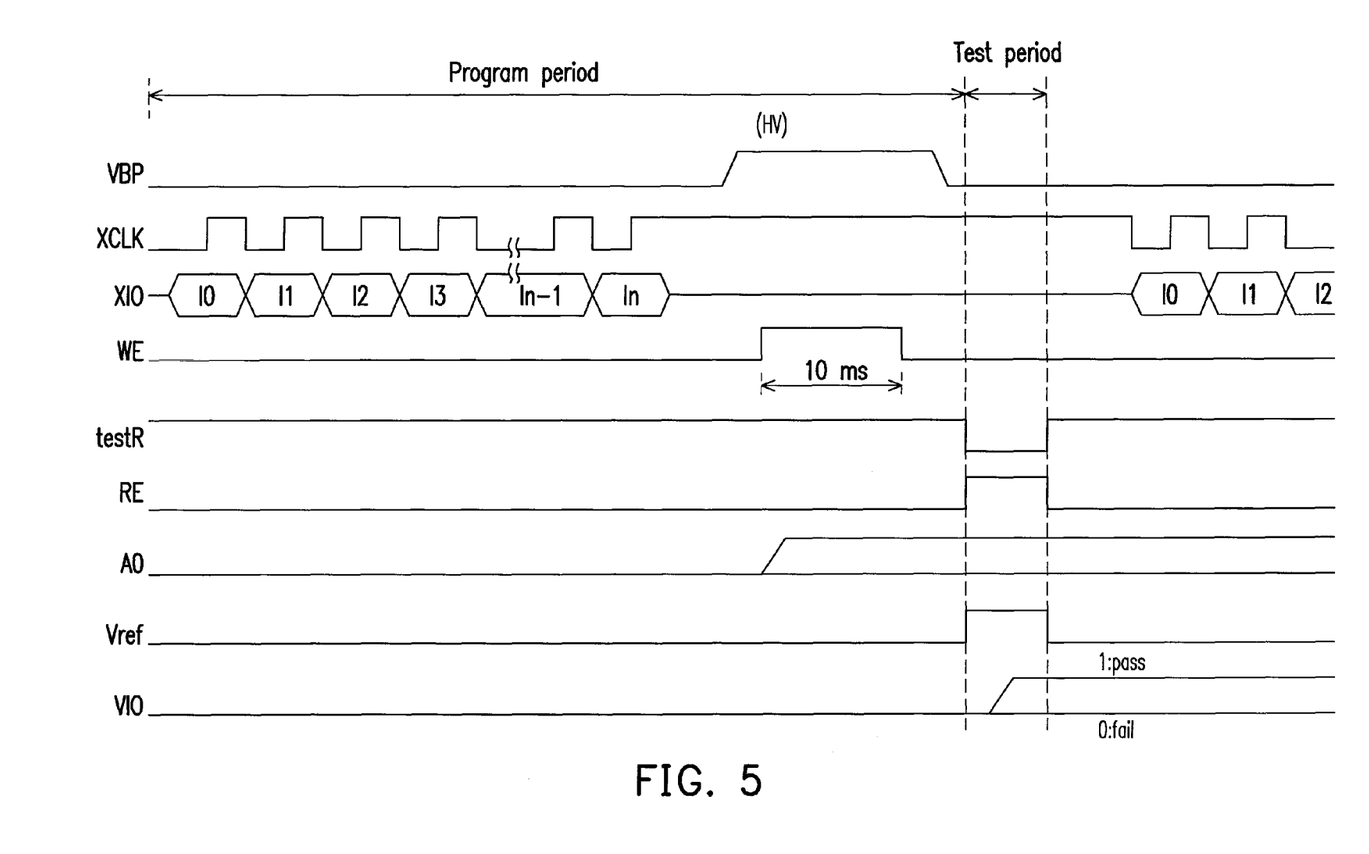
FIG. 5 shows waveforms of signals in FIG. 1 to FIG. 3 during the programming period and the test period according to an exemplary embodiment of the invention.

FIG. 2 illustrates a circuit diagram of the anti-fuse unit shown in FIG. 1 according to an exemplary embodiment of the invention. FIG. 3 illustrates a circuit diagram of the shift register shown in FIG. 1 according to an exemplary embodiment of the invention. FIG. 4 shows waveforms of signals in FIG. 1 to FIG. 3 during the normal operation according to an exemplary embodiment of the invention. FIG. 5 shows waveforms of signals in FIG. 1 to FIG. 3 during the programming period and the test period according to an exemplary embodiment of the invention.

In the exemplary embodiment of the invention, each of the anti-fuse units includes an anti-fuse core, a comparator, two latch units, and a switch unit, and each of the shift registers includes two switch units and two latch units. The anti-fuse unit 112-0 and the shift register 114-0 are exemplary respectively in FIG. 2 and FIG. 3. Referring to FIG. 2 and FIG. 3, the anti-fuse unit 112-0 includes an anti-fuse core 1122-0, a comparator 1124-0, two latch units 1126a-0 and 1126b-0, and a switch unit 1128-0, and the anti-fuse unit 112-0 includes the switch units 1142a-0 and 1142b-0 and the latch units 1144a-0 and 1144b-0.

Specifically, Referring to FIG. 2 to FIG. 5, the anti-fuse unit 112-0 and the shift register 114-0 are exemplary in the following. The anti-fuse core 1122-0 receives the stress voltage VBP, the program data I0, and the write enable signal WE. Herein, the stress voltage VBP may be a high voltage about 8V-10V to stress the anti-fuse element 1121-0. During the programming period, the program data XIO is first received by the shift register 114-N via the input end IN, and then the program data I0 to In are sequentially transmitted, which is controlled by the clock signal XCLK. The shift register 114-0 would receive the program data I0. Next, when the write enable signal WE is enabled for a specific period such as 10 us, the stress voltage VBP stresses the anti-fuse core 1122-0 according to the program data I0, and then the anti-fuse core 1122-0 outputs a third programming result A0. In the present embodiment, according to the program data I0, if the anti-fuse core 1122-0 is stressed, it would output the third programming result A0 with the logic high; and by contrast, if the anti-fuse core 1122-0 is not stressed, it would output the third programming result A0 with the logic low. The comparator 1124-0 is coupled to the anti-fuse core 1122-0 and enabled by a read signal RE. The comparator 1124-0 compares the third programming result A0 with a reference signal Vref and outputs the first programming result P0. The latch unit 1126a-0 is coupled to the comparator 1124-0 and latches the first programming result P0. The switch unit 1128-0 is coupled to the latch unit 1126a-0 and controlled by a control signal PMRS. The latch unit 1126b-0 is coupled to the switch unit 1128-0. The latch unit 1126b-0 latches the first programming result P0 when the switch unit 1128-0 is turned on by the control signal PMRS, and then the latch unit 1126b-0 outputs the second programming result X0. The other anti-fuse units 112-1 to 112-N operate in the same manner as that of the anti-fuse unit 112-0, and it will not be described again herein.

In detail, the anti-fuse core 1122-0 includes an anti-fuse element 1121-0, a program switch Q1, a test switch Q2, a protection switch Q3, an AND gate 1123a-0, and a NAND gate 1123b-0. In the present embodiment, each of the anti-fuse cores includes an anti-fuse element, a program switch, a test switch, an AND gate, and a NAND gate. The anti-fuse element 1121-0 receives the stress voltage VBP. The AND gate 1123a-0 receives the write enable signal WE and the program data I0 and controls the conduction of the program switch Q1 by the output WE0 of the AND gate 1123a-0. The program switch Q1 is coupled to the anti-fuse element 1121-0 through the protection switch Q3. During the programming period, when the write enable signal WE is enabled, the program switch Q1 is turned on according to the program data I0. The stress voltage VBP stresses the anti-fuse element 1121-0 when the program switch Q1 is turned on. In the present embodiment, the protection switch Q3 increases a threshold voltage between the node N and the anti-fuse element 1121-0 to avoid the devices coupled to the node N being stressed by the stress voltage VBP during the programming period. The NAND gate 1123b-0 receives the test signal testR, a control signal DMRS, and a power-up signal PU and controls the conduction of the test switch Q2. The test switch Q2 is coupled to the anti-fuse element 1121-0 through the protection switch Q3. During the test period, the test switch Q2 is turned on by the read signal RE, and the third programming result A0 is compared with the reference signal Vref.

In the present embodiment, the voltage of the reference signal Vref during the test period is higher than that of the reference signal Vref during the programming period to ensure that the test is proper as shown in FIG. 5. Furthermore, the width/length ratio W1/L1 of the program switch Q1 is larger than the width/length ratio W2/L2 of the test switch Q2, e.g. W1/L1=10 W2/L2. Accordingly, when the program switch Q1 is turned on during the programming period, the stress voltage VBP provides a large current flowing the path of the anti-fuse element 1121-0, the protection switch Q3, and the program switch Q1 to stress the anti-fuse element 1121-0. As a result, the anti-fuse element 1121-0 would operate in a manner as that of a resistor after being stressed.

On the other hand, referring to FIG. 2 and FIG. 4, during the normal operation, when the signal PU is powered up, the system voltage $V_{DD}$ would gradually rise up to a high level. Before users execute a MRS command, the power-up signal PU and the test signal testR stay in the logic high, the control signal DMRS stays in the logic low, and thus the NAND gate 1122-0 outputs the read signal RE with the logic high to turn on the test switch Q2. The test switch Q2 consumes some power before users execute the MRS command. In the meanwhile, if the anti-fuse element 1121-0 is not stressed yet, it would output the third programming result A0 with the logic low such as 0, and the comparator 1124-0 also output the first programming result P0 with the logic low. After users execute the MRS command for a short period, the control signal DMRS changes to the logic high, and thus the NAND gate 1122-0 outputs the read signal RE with the logic low to turn off the test switch Q2. Accordingly, the power consumption of the test switch Q2 is reduced. In the meanwhile, the control signal PMRS goes to the logic high and turns on the switch unit 1128-0, and thus the first programming result P0 latched in the latch unit 1126a-0 is transmitted to the latch unit 1126b-0. Accordingly, the second programming result X0 also stays in the logic low.

Figure 6:
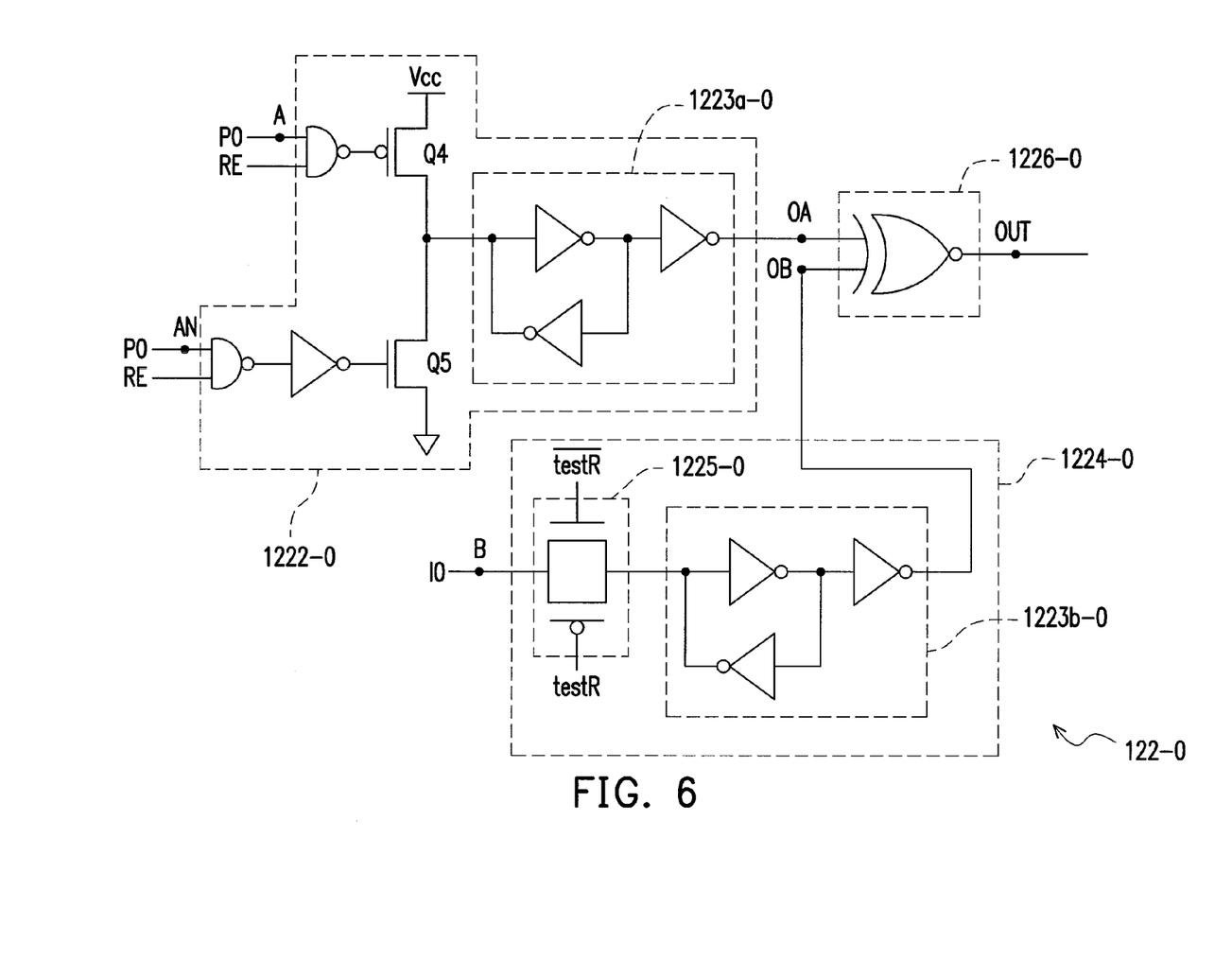
FIG. 6 illustrates a circuit diagram of the test unit shown in FIG. 1 according to an exemplary embodiment of the invention.

FIG. 6 illustrates a circuit diagram of the test unit shown in FIG. 1 according to an exemplary embodiment of the invention. In the exemplary embodiment of the invention, each of the test units includes a programming result receiving channel, a program data receiving channel, and a comparison unit. Referring to FIG. 6, the test unit 122-0 is exemplary. The programming result receiving channel 1222-0 is controlled by the read signal RE. The programming result receiving channel 1222-0 receives the first programming results P0 and /P0 respectively via the input ends A and AN and outputs the different logic levels according to the first programming result P0 via the output end OA. The program data receiving channel 1224-0 is controlled by the test signal testR. The program data receiving channel 1224-0 receives the program data I0 via the input end B and outputs the different logic levels according to the program data I0 via the output end OB. During the test period, if RE=1, P0=1, and /P0=0, the switch Q4 is turned on, the switch Q5 is turned off, and the programming result receiving channel 1222-0 outputs 1 via the output end OA; and by contrast, if RE=1, P0=0, and /P0=1, the switch Q4 is turned off, the switch Q5 is turned on, and the programming result receiving channel 1222-0 outputs 0 via the output end OA. Furthermore, if RE=0, the output of the programming result receiving channel 1222-0 is latched by the latch unit 1223a-0. On the other hand, during the test period, the test signal testR goes to the logic low, and thus the switch unit 1225-0 is turned. Accordingly, the program data I0 is transmitted through the latch unit 1223b-0 and outputted via the output end OB.

The comparison unit 1226-0 receives and compares the outputs of the programming result receiving channel 1222-0 and the program data receiving channel 1224-0 and outputs the different logic levels according to the comparison result. Herein, the comparison unit 1226-0 includes an XNOR gate to compare the outputs of the programming result receiving channel 1222-0 and the program data receiving channel 1224-0. If the program data I0 and the programming result P0 match, the comparison unit 1226-0 would output the logic high; and by contrast, if the program data I0 and the programming result P0 mismatch, the comparison unit 1226-0 would output the logic low.

Figure 7:
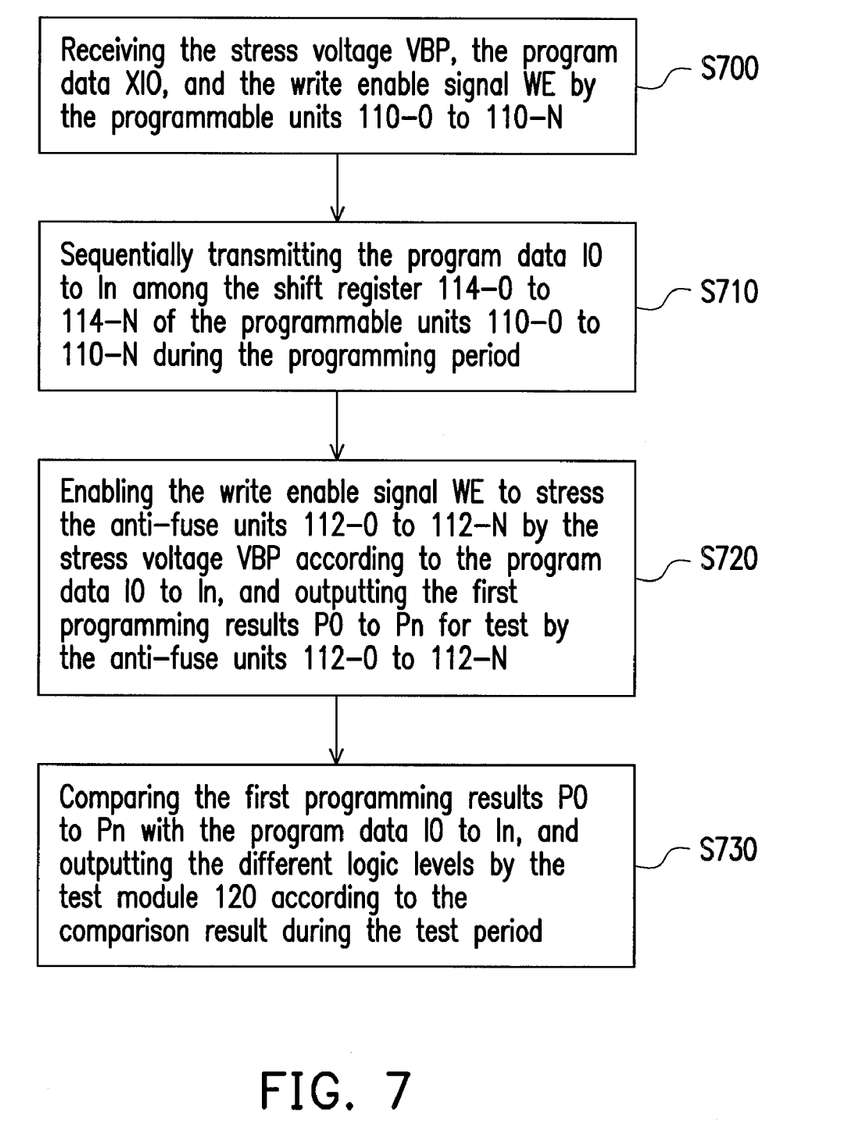
FIG. 7 is a flowchart of a method for anti-fuse programming and test adapted to the foregoing anti-fuse circuit according to an embodiment of the invention.

FIG. 7 is a flowchart of a method for anti-fuse programming and test adapted to the foregoing anti-fuse circuit 100 according to an embodiment of the invention. Referring to FIG. 1, FIG. 2 and FIG. 7, in step S700, the stress voltage VBP, the program data XIO, and the write enable signal WE are received by the programmable units 110-0 to 110-N. Next, in step S710, the program data I0 to In is sequentially transmitted among the shift register 114-0 to 114-N of the programmable units 110-0 to 110-N during the programming period. In step S720, the write enable signal WE is enabled to stress the anti-fuse units 112-0 to 112-N by the stress voltage VBP according to the program data I0 to In, and the first programming results P0 to Pn for test is outputted by the anti-fuse units 112-0 to 112-N. In step S730, the first programming results P0 to Pn is compared with the program data I0 to In, and the different logic levels are outputted by the test module 120 according to the comparison results during the test period. Accordingly, in the present embodiment, the programming and test are serial, such that it is easy to check whether the programming finishes or not, and the serial programming is convenient to memory address.

Besides, the method for anti-fuse programming and test in this embodiment of the invention is sufficiently taught, suggested, and embodied in the embodiments illustrated in FIG. 1 to FIG. 6, and therefore no further description is provided herein.

In summary, for the anti-fuse circuit of the invention, the programming and test are respectively performed by the programmable units and the test module in series. Accordingly, it is easy to check whether the programming finishes or not, and the serial programming is convenient to memory address.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An anti-fuse circuit, comprising:
a plurality of programmable units receiving a stress voltage, a program data, and a write enable signal, wherein during a programming period, the programmable units sequentially transmit the program data, when the write enable signal is enabled, the stress voltage stresses the programmable units according to the program data, and the programmable units output first programming results for test; and
a test module coupled to the programmable units and receiving the program data and the first programming results, wherein during a test period, the test module compares the first programming results with the program data and outputs different logic levels according to a result of the comparison of the first programming results and the program data.

2. The anti-fuse circuit as claimed in claim 1, wherein each of the programmable units comprises:
an anti-fuse unit having a first input end, a second input end, a first output end, and a second output end, wherein the first input end of the anti-fuse unit receives the write enable signal, the second input end of the anti-fuse unit receives the program data, the first output end of the anti-fuse unit outputs a corresponding one of the first programming results, and the second output end of the anti-fuse unit outputs a corresponding second programming result; and
a shift register having an input end, a clock input end, and an output end, wherein the input end of the shift register receives the program data, the clock input end of the shift register receives a clock signal, and the output end of the shift register outputs the program data to the second input end of the corresponding anti-fuse unit.

3. The anti-fuse circuit as claimed in claim 2, wherein the shift registers are controlled by the clock signal and sequentially transmit the program data during the programming period.

4. The anti-fuse circuit as claimed in claim 1, wherein each of the programmable units comprises an anti-fuse unit, and each of the anti-fuse units comprises:
an anti-fuse core receiving the stress voltage, the program data, and the write enable signal, wherein during the programming period, when the write enable signal is enabled, the stress voltage stresses the anti-fuse core according to the program data, and the anti-fuse core outputs a corresponding third programming result.

5. The anti-fuse circuit as claimed in claim 4, wherein each of the anti-fuse units further comprises:
a comparator coupled to the anti-fuse core, enabled by a read signal, comparing the third programming result with a reference signal, and outputting the corresponding one of the first programming results;
a first latch unit coupled to the comparator and latching the corresponding one of the first programming results;
a first switch unit coupled to the first latch unit and controlled by a control signal; and
a second latch unit coupled to the first switch unit, latching the corresponding one of the first programming results when the first switch unit is turned on, and output the second programming result.

6. The anti-fuse circuit as claimed in claim 4, wherein each of the anti-fuse cores comprises:
an anti-fuse element receiving the stress voltage;
a program switch coupled to the anti-fuse element, wherein during the programming period, when the write enable signal is enabled, the program switch is turned on according to the program data, and the stress voltage stresses the anti-fuse element when the program switch is turned on; and
a test switch coupled to the anti-fuse element, wherein during the test period, the test switch is turned on by a read signal, and the third programming result is compared with a reference signal.

7. The anti-fuse circuit as claimed in claim 6, wherein a width/length ratio of the program switch is larger than a width/length ratio of the test switch.

8. The anti-fuse circuit as claimed in claim 6, wherein a voltage of the reference signal during the test period is higher than that of the reference signal during the programming period.

9. The anti-fuse circuit as claimed in claim 1, wherein the test module comprises:
a plurality of test units coupled to the programmable units one for one, wherein during the test period, the test units receive the program data and the first programming results, compare the first programming results with the program data, and output the different logic levels according to the result of the comparison of the first programming results and the program data.

10. The anti-fuse circuit as claimed in claim 9, wherein each of the test units has a first input end, a second input end, and an output end, and the first input ends of the test units receive the program data, the second input ends of the test units receive the first programming results, and the output ends of the test units output the different logic levels according to the result of the comparison of the first programming results and the program data.

11. The anti-fuse circuit as claimed in claim 9, wherein the test module further comprises:
an AND gate coupled to the output ends of the test units, performing an AND operation on the logic levels outputted from the test units, and outputting an operation result;
a second switch unit coupled to an output end of the AND gate and controlled by a test signal;
a third latch unit coupled to the second switch unit and latching the operation result when the second switch unit is turned on; and
a third switch unit coupled to the third latch unit and controlled by the test signal, wherein the third latch unit outputs the operation result as a test result when the third switch unit is turned on.

12. The anti-fuse circuit as claimed in claim 9, wherein each of the test units comprises:
a programming result receiving channel receiving the first programming result, controlled by a read signal, and outputting the different logic levels according to the first programming result;
a program data receiving channel receiving the program data, controlled by a test signal, and outputting the different logic levels according to the program data; and
a comparison unit receiving and comparing the outputs of the programming result receiving channel and the program data receiving channel and outputting the different logic levels according to the result of the comparison of the first programming results and the program data.

13. The anti-fuse circuit as claimed in claim 11, wherein the comparison unit comprises an XNOR gate.

14. A method for anti-fuse programming and test, adapted to an anti-fuse circuit, wherein the anti-fuse circuit comprises a plurality of programmable units and a test module, the method comprising:

receiving a stress voltage, a program data, and a write enable signal;

sequentially transmitting the program data among the programmable units during a programming period;

enabling the write enable signal to stress the programmable units by the stress voltage according to the program data and output first programming results for test during the programming period; and comparing the first programming results with the program data and outputting different logic levels by the test module according to a result of the comparison of the first programming results and the program data during a test period.

15. The method as claimed in claim 14, wherein in the step of sequentially transmitting the program data among the programmable units, sequentially transmitting the program data according to a clock signal during the programming period.

16. The method as claimed in claim 14, wherein each of the programmable units comprises an anti-fuse unit, each of the anti-fuse units comprises an anti-fuse core, and the step of enabling the write enable signal comprises:

stressing the anti-fuse cores according to the program data to outputs a second programming result; and comparing the second programming result with a reference signal to output the corresponding one of the first programming results for test.

17. The method as claimed in claim 16, wherein each of the anti-fuse cores comprises an anti-fuse element, a program switch, and a test switch, and the step of stressing the anti-fuse cores comprises:

turning on the program switches according to the program data to stress the anti-fuse elements when the program switches are turned on during the programming period; and turning on the test switches by a read signal during the test period to compare the second programming result with the reference signal.

18. The method as claimed in claim 17, wherein a width/length ratio of the program switch is larger than a width/length ratio of the test switch.

19. The method as claimed in claim 17, wherein a voltage of the reference signal during the test period is higher than that of the reference signal during the programming period.

* * * * *